(12) United States Patent
Furuya

(10) Patent No.: US 10,638,643 B2
(45) Date of Patent: Apr. 28, 2020

(54) ELECTRONIC DEVICE

(71) Applicant: CANON KABUSHIKI KAISHA, Tokyo (JP)

(72) Inventor: Takahiro Furuya, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/183,127

(22) Filed: Nov. 7, 2018

(65) Prior Publication Data

US 2019/0150318 A1  May 16, 2019

(30) Foreign Application Priority Data

Nov. 14, 2017  (JP) ................... 2017-219405
Oct. 1, 2018   (JP) ................... 2018-186379

(51) Int. Cl.
*H05K 7/00*   (2006.01)
*H05K 7/20*   (2006.01)
*H05K 5/03*   (2006.01)
*G03B 17/55*  (2006.01)
*H04N 5/225*  (2006.01)

(52) U.S. Cl.
CPC ........ *H05K 7/20409* (2013.01); *G03B 17/55* (2013.01); *H05K 5/03* (2013.01); *H05K 7/20154* (2013.01); *H05K 7/20181* (2013.01); *H04N 5/2252* (2013.01); *H04N 5/22521* (2018.08)

(58) Field of Classification Search
CPC .......... H05K 7/20181; H05K 7/20154; H05K 7/20409; H05K 5/03; H05K 7/20336
USPC ........ 361/695, 704, 709–710, 714, 720–721
See application file for complete search history.

(56) References Cited

U.S. PATENT DOCUMENTS

| 5,583,316 | A   | 12/1996 | Kitahara et al. | |
|-----------|-----|---------|----------------|--|
| 5,751,062 | A   | 5/1998  | Daikoku et al. | |
| 6,072,697 | A   | 6/2000  | Garcia-Ortiz   | |
| 7,706,684 | B2  | 4/2010  | Suzuki         | |
| 8,233,040 | B2* | 7/2012  | Patel          | G06K 7/10 348/61 |
| 8,388,141 | B2* | 3/2013  | Tanaka         | G03B 21/16 165/121 |
| 8,675,706 | B2* | 3/2014  | Seurin         | H01S 5/4018 372/50.124 |
| 8,872,121 | B2* | 10/2014 | Kato           | H01L 27/14618 250/370.15 |

(Continued)

FOREIGN PATENT DOCUMENTS

CN   2718780 Y   8/2005
CN   201576530 U 9/2010

(Continued)

OTHER PUBLICATIONS

Extended European Search Report dated Jul. 22, 2019 in Patent Application No. 18204405.7, citing documents AA-AC and AO therein, 6 pages.

(Continued)

*Primary Examiner* — William H. Mayo, III
(74) *Attorney, Agent, or Firm* — Venable LLP

(57) ABSTRACT

An electronic device includes a casing and substrates. The casing includes a plurality of fins including hollow fins. The substrates are inserted in the hollow fins so as to be sandwiched between inner walls of the hollow fins in a contact or non-contact manner, and that include electronic circuits.

20 Claims, 17 Drawing Sheets

(56) References Cited

U.S. PATENT DOCUMENTS

| | | | | |
|---|---|---|---|---|
| 8,876,297 B2* | 11/2014 | Fujinawa | ............... | G03B 21/16 |
| | | | | 353/52 |
| 9,480,189 B2* | 10/2016 | Kawai | ................. | H05K 1/0203 |
| 9,628,731 B2* | 4/2017 | Kang | ................... | H04N 5/2253 |
| 9,838,558 B2* | 12/2017 | Petty | ................. | H04N 1/00981 |
| 2010/0046168 A1 | 2/2010 | Liaw | | |
| 2011/0235278 A1* | 9/2011 | Hara | ................... | H01L 23/3675 |
| | | | | 361/715 |
| 2014/0198457 A1 | 7/2014 | Wong et al. | | |
| 2014/0328021 A1* | 11/2014 | Tang | ................. | H05K 7/20781 |
| | | | | 361/699 |
| 2017/0064868 A1* | 3/2017 | Rush | ................ | H05K 7/20336 |
| 2017/0112018 A1* | 4/2017 | Krivonak | ............. | H01L 23/467 |

FOREIGN PATENT DOCUMENTS

| | | |
|---|---|---|
| CN | 201733567 U | 2/2011 |
| CN | 102290388 A | 12/2011 |
| CN | 103619147 A | 3/2014 |
| CN | 204206691 U | 3/2015 |
| CN | 206117841 U | 4/2017 |
| EP | 0717440 A2 | 6/1996 |
| JP | H06-061387 A | 3/1994 |
| JP | 2017-11303 | 1/2017 |
| RU | 2 440 702 C1 | 1/2012 |
| WO | 9404013 A1 | 2/1994 |
| WO | 9413012 A1 | 6/1994 |

OTHER PUBLICATIONS

Chinese Office Action issued in corresponding Chinese Application No. 201811344994.3 dated Jan. 9, 2020.

* cited by examiner

US 10,638,643 B2

ELECTRONIC DEVICE

CROSS-REFERENCE TO RELATED APPLICATIONS

This application is based upon and claims the benefit of priority from Japanese Patent Application No. 2017-219405, filed on Nov. 14, 2017; and Japanese Patent Application No. 2018-186379, filed Oct. 1, 2018; the entire contents of which are incorporated herein by reference.

FIELD

Embodiments described herein relate generally to an electronic device.

BACKGROUND

In electronic devices, such as industrial cameras, electronic components or the like provided inside casings generate heat, and it is necessary to appropriately dissipate the heat. For example, from the viewpoint of preventing degradation or breakdown of the electronic components or the like provided inside the casings, in some cases, a performance guarantee temperature corresponding to the upper limit temperature inside the casings may be determined. In addition, with regard to electronic devices that may be touched by hands of users, in some cases, the upper limit temperature of surfaces of casings may be determined from the viewpoint of preventing low temperature burn or the like.

Conventionally, in electronic devices, a performance guarantee temperature inside the casings and the upper limit temperature of the surfaces of the casings as described above have been maintained by minor design innovation. However, with improvement of performance and functions of the electronic devices, power consumption is increasing and the amount of heat generation is increasing.

DETAILED DESCRIPTION

An electronic device according to an embodiment includes a casing and substrates. The casing includes a plurality of fins including hollow fins. The substrates are inserted into the hollow fins and include electronic circuits.

Embodiments of an electronic device will be described below with reference to the drawings. The embodiments are not limited to those described below. In addition, contents described in a single embodiment or modification is, in principle, applicable to other embodiments and modifications in the same manner.

First Embodiment

Figure 1:
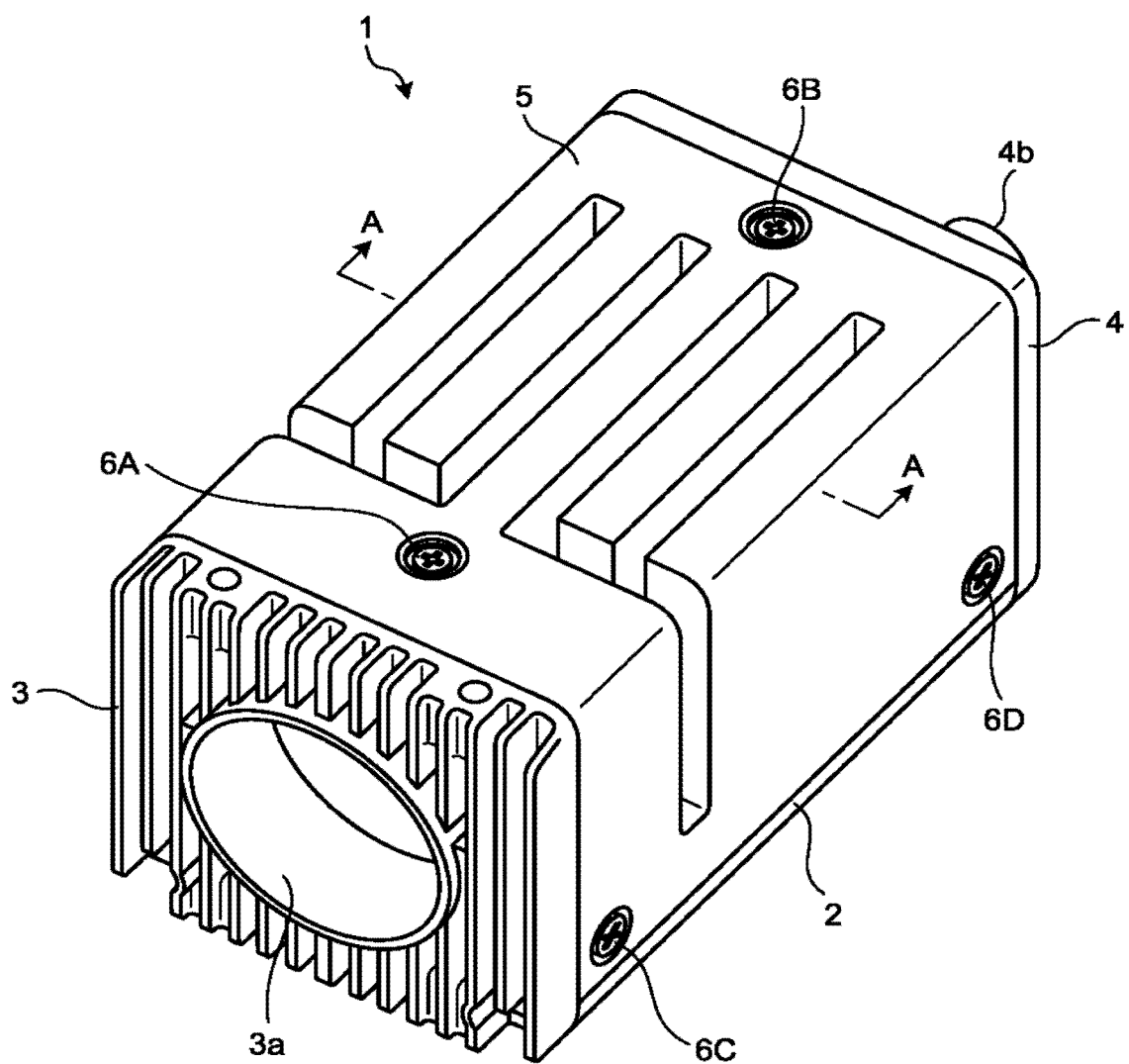
FIG. 1 is an external perspective view illustrating a configuration example of an electronic device according to a first embodiment.
Figure 2:
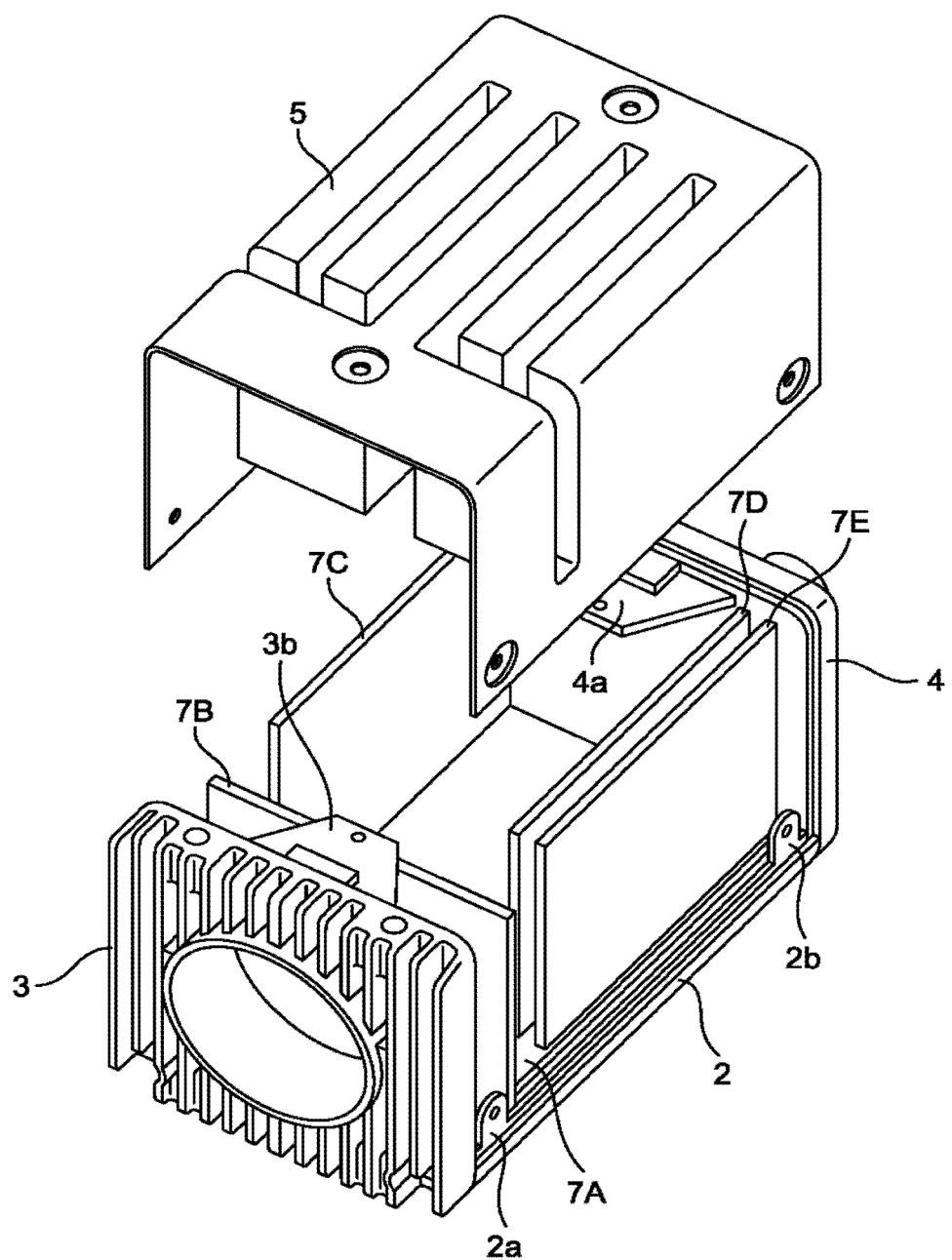
FIG. 2 is a perspective view illustrating a state in which a top cover of the electronic device is removed.
Figure 3A:
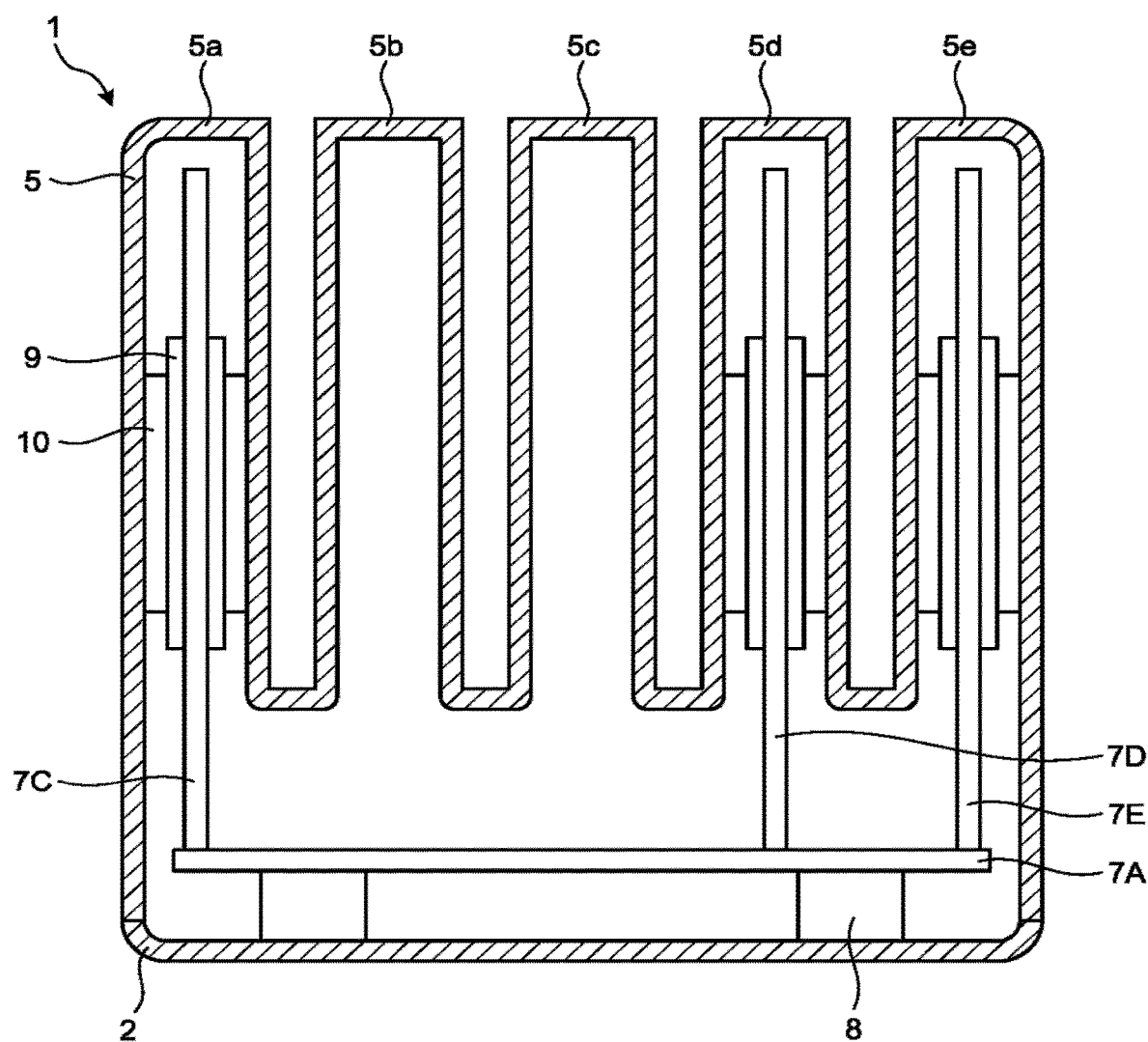
FIG. 3A is an end view taken along A-A in FIG. 1.

FIG. 1 is an external perspective view illustrating configuration example of an electronic device 1 according to a first embodiment. The electronic device 1 is assumed to be a camera to which a lens unit (not illustrated) is attached. In FIG. 1, the electronic device 1 has a casing that is formed in an approximately rectangular box shape with a bottom cover 2 that constitutes a bottom surface and a part of side surfaces, a front cover 3 that constitutes a front surface, a back cover 4 that constitutes a back surface, and a top cover 5 that constitutes an upper surface and most of the side surfaces. The bottom cover 2, the front cover 3, the back cover 4, and the top cover 5 are manufactured by thin-wall die casting or the like. A connector receiver 4b for a power cord or the like is provided on the back cover 4. FIG. 2 is a perspective view illustrating a state in which the top cover 5 of the electronic device 1 is removed. FIG. 3A is an end view taken along A-A in FIG. 1.

The front surface may be referred to as a first surface. The back surface that faces the front surface may be referred to as a second surface. The upper surface (top surface) that is perpendicular to the back surface may be referred to as a third surface. The bottom surface that faces the upper surface may be referred to as a fourth surface. A right side surface that is perpendicular to the front surface and the upper surface may be referred to as a fifth surface. A left side surface that faces the right side surface may be referred to as a sixth surface.

In FIG. 1 to FIG. 3A, the bottom cover 2 has a flat plate shape with upward bending portions on the right side surface and the left side surface. Lower ends of the front cover 3 are fixed to front ends (end portions on the front surface side) of the bottom cover 2 with screws or the like, and lower ends of the back cover 4 are fixed to rear ends of the bottom cover 2 with screws or the like. The top cover 5 is fixed to a fixing piece 3b, which is provided on the back side of an upper end of the front cover 3, with a screw 6A, fixed to a fixing piece 4a, which is provided on the back side of an upper end of the back cover 4, with a screw 6B, and fixed to fixing pieces 2a and 2b, which are provided on side surfaces of the bottom cover 2, with screws 6C and 6D.

A substrate 7A including an electronic circuit is fixed on the inner side of a bottom surface of the bottom cover 2 via a spacer 8 such that a substrate surface with the electronic circuit is oriented horizontally. A substrate 7B is fixed in a vertical direction on a front surface side of the substrate surface of the substrate 7A such that a substrate surface of the substrate 7B faces the front surface. In addition, a plurality of substrates 7C, 7D, and 7E are fixed in a vertical direction on the substrate surface of the substrate 7A such that substrate surfaces of the substrates 7C, 7D, and 7E face the side surfaces. While the case is illustrated in which the substrate 7A is indirectly fixed on the inner side of the bottom surface of the bottom cover 2 via the spacer 8, it may be possible to directly fix the substrate 7A to the bottom cover 2.

An opening 3a to which the lens unit is attached is provided in the center of a front surface of the front cover 3, and a heatsink including a plurality of fins is provided around the opening 3a. An image sensor (not illustrated) that is provided on the substrate 7B is arranged on the inner side of the opening 3a of the front cover 3, and the lens unit attached to the opening 3a forms an image of an imaging object on a light receiving surface of the image sensor. The heatsink provided on the front cover 3 is mainly used to dissipate heat from the substrate 7B on which the image sensor is mounted; however, if heat from the substrate 7B can be adequately dissipated using a different heat discharging mechanism, the heatsink of the front cover 3 may be omitted. Meanwhile, an image captured by the image sensor is processed into an image signal by electronic circuits (electronic components) 9 that are arranged on the substrates 7A to 7E, and a final image signal is output to the outside of the device via a connector or the like.

The top cover 5, in itself, is formed into a plurality of fins, and the fins include hollow fins. In this example, a case will be described in which all of the fins are formed into the hollow fins using outer concave and convex patterns of the top cover 5. Fins 5a, 5d, and 5e among hollow fins 5a to 5e are configured such that most parts from ends of the substrates 7C, 7D, and 7E are accommodated (inserted) in inner hollow portions thereof. Here, a state in which the most parts of the substrates are accommodated indicates a state in which, for example, more than halves of the electronic circuits 9 provided on the substrates are accommodated. Further, each of the substrates 7C, 7D, and 7E is sandwiched between inner walls of each of the hollow fins 5a, 5d, and 5e in a contact or non-contact manner. Furthermore, each of the substrates 7C, 7D, and 7E is arranged approximately parallel to the inner walls of each of the hollow fins 5a, 5d, and 5e.

While the case is illustrated in which the substrates 7C, 7D, and 7E are accommodated in the fins 5a, 5d, and 5e and substrates are not accommodated in the fins 5b and 5c, it may be possible to accommodate substrates in all of the fins 5a to 5e, or it may be possible not to accommodate a fin different from the fins indicated in the drawings, depending on circuit configurations. It may be possible to accommodate, in the hollow fin in which the substrate is not accommodated, a signal line to which an electronic circuit included in the image sensor or the substrate is connected. However, because the outer fins 5a and 5e are likely to be exposed to the air and increase a heat dissipate effect, it is preferable to preferentially accommodate, in the outer fins 5a and 5e, substrates mounted with electronic circuits that generate large amounts of heat.

Further, the electronic circuits 9 provided on the substrates 7C, 7D, and 7E that are accommodated in the inner hollow portions of the fins 5a, 5d, and 5e are thermally connected to the inner walls of the fins 5a, 5d, and 5e via heat-transfer members 10 that are made with silicone-type or acrylic-type heat-transfer sheet. In FIG. 3A, the electronic circuits 9 are thermally connected to the inner walls of the fins 5a, 5d, and 5e via the heat-transfer members 10 on both surfaces of each of the substrates 7C, 7D, and 7E, but may be thermally connected to only one surfaces. If the heat dissipate effect can be adequately achieved only by accommodating the substrates in the hollow portions of the fin 5a and the other fines, it may be possible to omit thermal connections using the heat-trans members 10.

While the case has been described in which the five fins 5a to 5e are provided, the number of the hollow fins is not limited to five, but may be changed arbitrarily if needed. Further, widths of the inner hollow portions of the hollow fins in a side-surface direction and widths between the adjacent hollow fins need not be uniform, but may be changed arbitrarily. However, the width of the inner hollow portion of each of the fins in the side-surface direction needs to be set such that a substrate can be accommodated and such that when the heat-transfer member 10 is used, thicknesses of the substrate, components, and the heat-transfer member 10 are taken into account. Further, it is preferable to set the width between the adjacent hollow fins in the side-surface direction to be equal to or larger than a certain width so as not to cause thermal boundaries (boundaries between portions in which convection occurs and portions in which convection does not occur) to overlap with each other and so as not to impede thermal convection. The top cover 5 is one example of a first member that corresponds to at least the third surface, the fifth surface, and the sixth surface and that includes the plurality of fins. The bottom cover 2 is one example of a second member that corresponds to the fourth surface.

It may be possible to cover openings of concave portions of the hollow fins with, for example, breathable mesh members to prevent the concave portions from being clogged with dust or the like.

Here, a heat flow rate in the case of heat discharging in the present embodiment will be described. In general, a heat flow rate from the casing is represented as follows.

Heat flow rate=surface area×heat transfer coefficient×(surface temperature−outside air temperature)

The heat flow rate is an amount of heat dissipated from the casing to the outside air per unit time. The surface area is an area in which the casing is exposed to the outside air. The heat transfer coefficient is amount of heat transfer due to natural convection of air per unit time and per unit difference of temperature. The surface temperature is the temperature of the surface of the casing. The outside air temperature is the temperature of the outside air.

The surface area of the casing of the electronic device 1 according to the present embodiment is increased due to the plurality of hollow fins 5a to 5e provided on the top cover 5, as compared to a casing with the same external dimension (about 2.3 times larger in the example illustrated in the drawings), and thus contributes to an increase in the heat flow rate. Meanwhile, the hollow fins 5a to 5e are provided by utilizing, for example, a space that is not used in a simple box-like (rectangular solid) casing, so that the size of the casing is not increased as compared to the box-like casing. It is even possible to reduce the external dimension of the casing.

Further, in the present embodiment, heat is dissipated from the electronic circuits 9 that are provided on the both surfaces of the substrates 7C, 7D, and 7E to the casing that is constituted of the top cover 5 and the like via the heat-transfer members 10, so that it is possible to bring the temperature of the top cover 5 close to the temperature of the electronic circuits 9. With this configuration, in the expression of the heat flow rate as described above, a difference between the surface temperature and the outside air temperature is increased, so that the heat dissipate amount is increased. That is, when the present embodiment is adopted, it is expected to further increase the heat flow rate, as compared to a case in which the present embodiment is not adopted, such as a case in which a casing is configured as a simple box-like shape without hollow fins and a heat-transfer member dissipates heat to the casing only from an electronic circuit that faces an inner wall of a substrate that faces an inner wall of the casing. In contrast, most of the electronic circuits 9 that are provided on the both surfaces of the substrates 7C, 7D, and 7E come in contact with the casing due to the heat-transfer members 10, and, from the viewpoint of thermal connection, the electronic circuits 9 are directly exposed to the outside air; therefore, even when the waterproof property and the dust resistance of the casing are improved, it is possible to effectively dissipate heat.

In addition, to further improve the heat dissipate effect of the casing, it is possible to increase the surface area by providing, for example, finer concave and convex patterns on the surface of the casing by emboss processing or the like using coating or surface processing.

Further, it is known that larger-than-necessary heat is generated in a thermally harsh environment. However, in the present embodiment, it is possible to reduce an increase in the temperature of the electronic circuits 9 by increasing the heat dissipate effect.

Meanwhile, from the viewpoint of preventing a user from getting burned, it may be possible to reduce the temperature of the outer surface of the casing that is likely to be touched by the hand of the user. In other words, in the example illustrated in FIG. 3A, it is likely that the temperature of the outer surface of the top cover 5 is increased because heat directly flows from the electronic circuits 9 on the substrates 7C and 7E to the outer surface of the top cover 5 via the heat-transfer members 10. To cope with this situation, it may be possible to reduce the temperature of the outer surface of the casing by causing heat to flow to a portion that is less likely to be touched by the hand of the user.

Figure 3B:
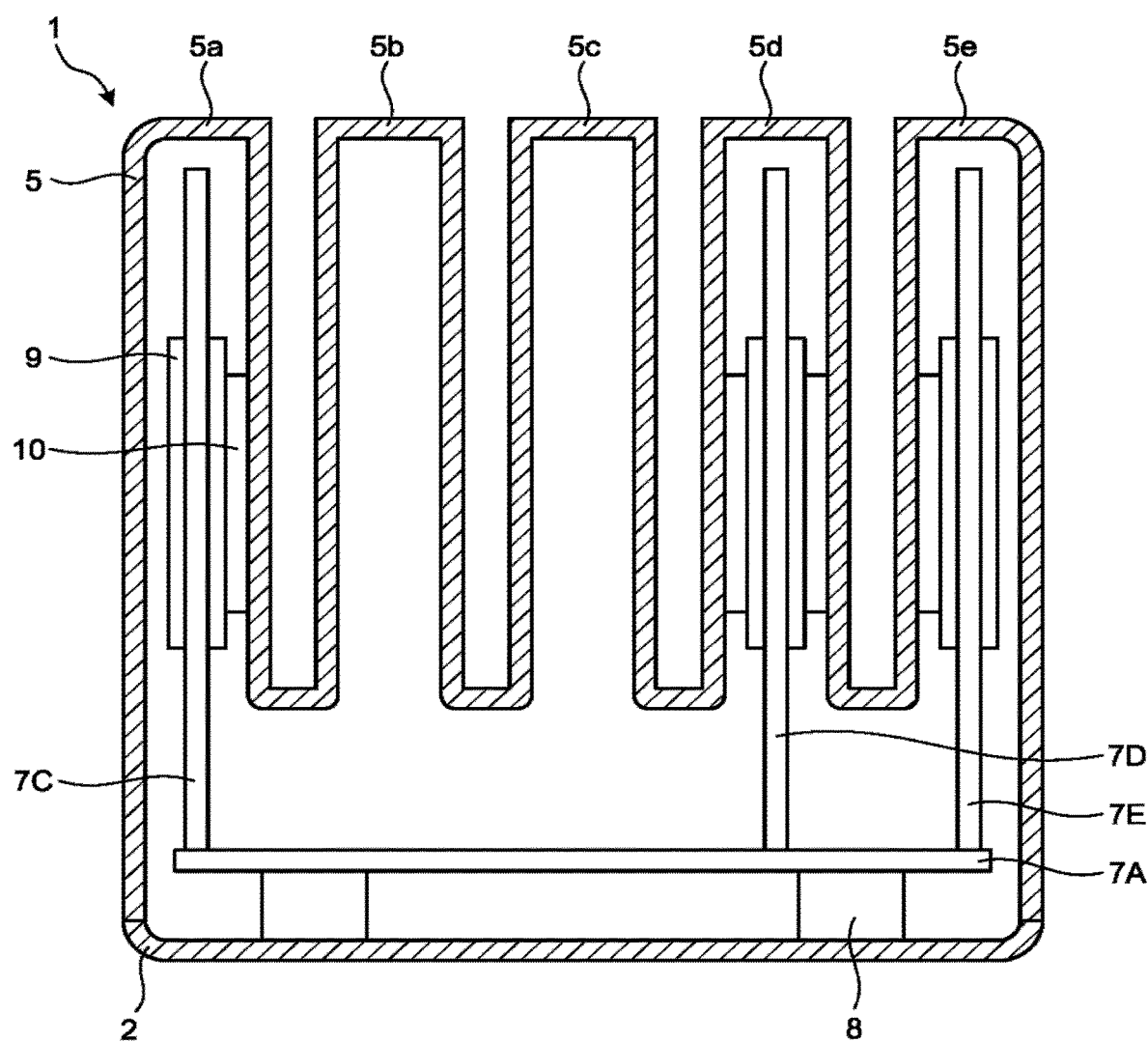
FIG. 3B is a diagram illustrating a first configuration example for preventing an increase in the temperature of an outer surface of a casing.

FIG. 3B is a diagram illustrating a configuration example for preventing an increase in the temperature of the outer surface of the casing. In FIG. 3B, with respect to the substrates 7C and 7E accommodated in the fins 5a and 5e that are located on the outer sides in the casing, the electronic circuits 9 facing the outer sides are not provided with the heat-transfer members 10 and not made contact with the inner walls of the top cover 5, but only the electronic circuits 9 facing the inner sides are provided with the heat-transfer members 10. With respect to the fin other than the fins 5a and 5e that are located on the outer sides of the casing, e.g., with respect to the substrate 7D accommodated in the fin 5d, it may be possible to provide the heat-transfer members 10 on the electronic circuits 9 on both sides. With this configuration, it is possible to prevent heat from directly flowing to the outer surface of the top cover 5, and reduce the temperature of the outer surface of the casing that is likely to be touched by the hand of the user.

Figure 3C:
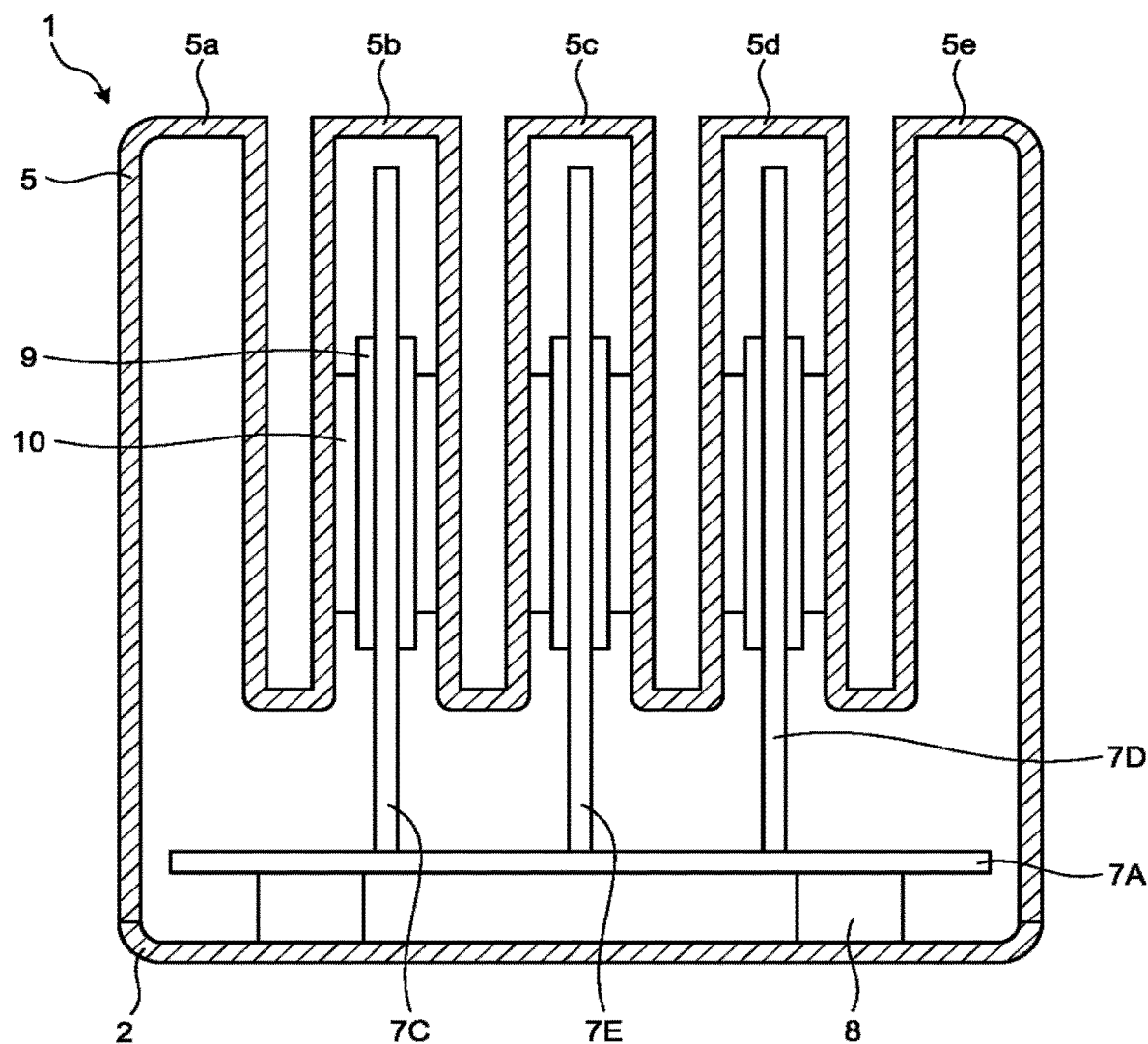
FIG. 3C is a diagram illustrating a second configuration example for preventing an increase in the temperature of the outer surface of the casing.

FIG. 3C is a diagram illustrating another configuration example for preventing an increase in the temperature of the outer surface of the casing. FIG. 3C illustrates a case in which the substrates 7C, 7E, and 7D are accommodated preferentially in the fins 5b, 5c, and 5d that are located on the inner side in the casing, and the fins 5a and 5e that are located on the outer sides in the casing are maintained vacant when substrates to be accommodated are not present. In this case, heat that flows to the outer surface of the top cover 5 is reduced, so that it is possible to further reduce the temperature of the outer surface of the casing that is likely to be touched by the hand of the user.

Second Embodiment

Figure 4:
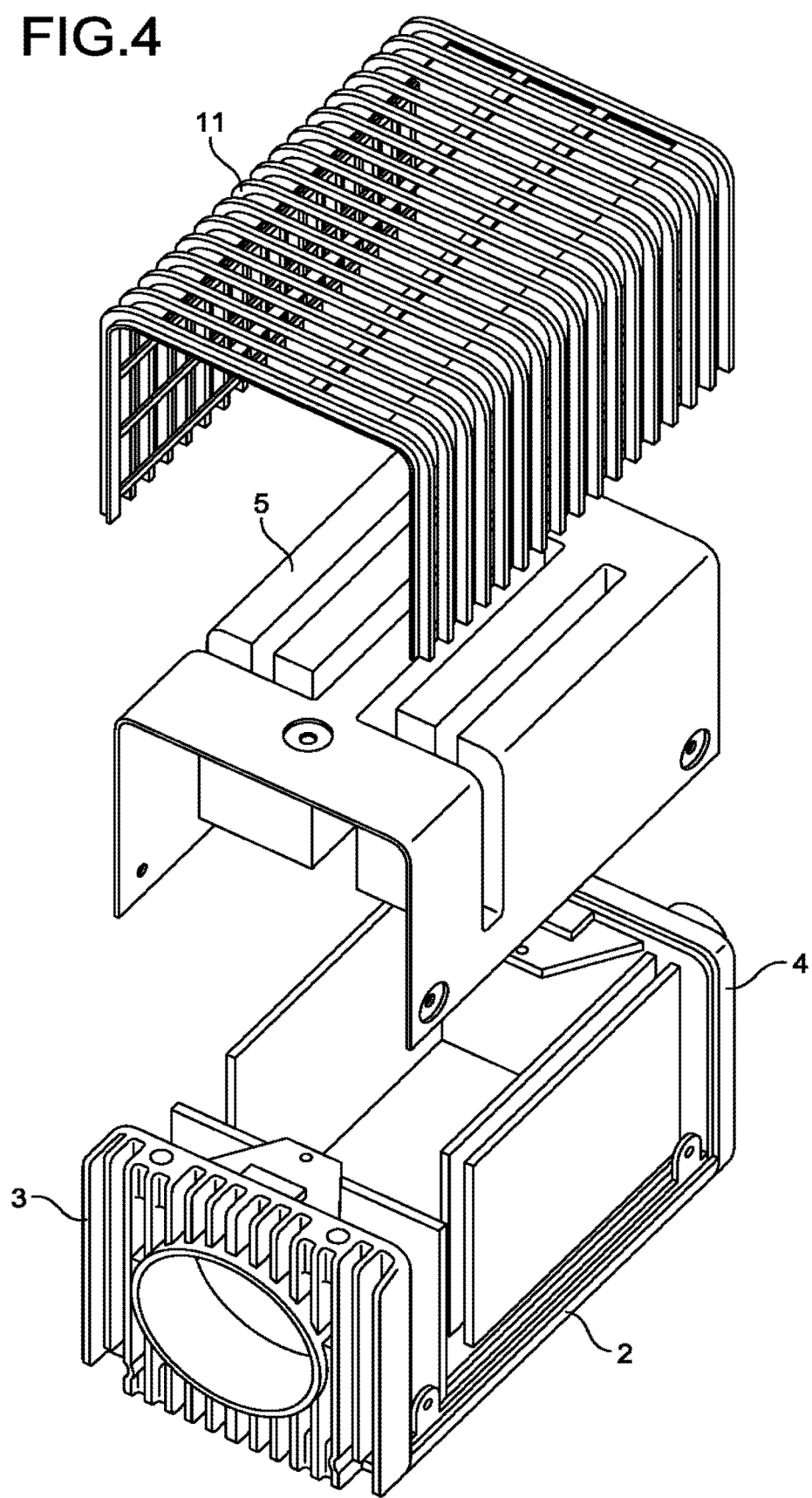
FIG. 4 is an external perspective view illustrating configuration example of an electronic device according to a second embodiment.
Figure 5:
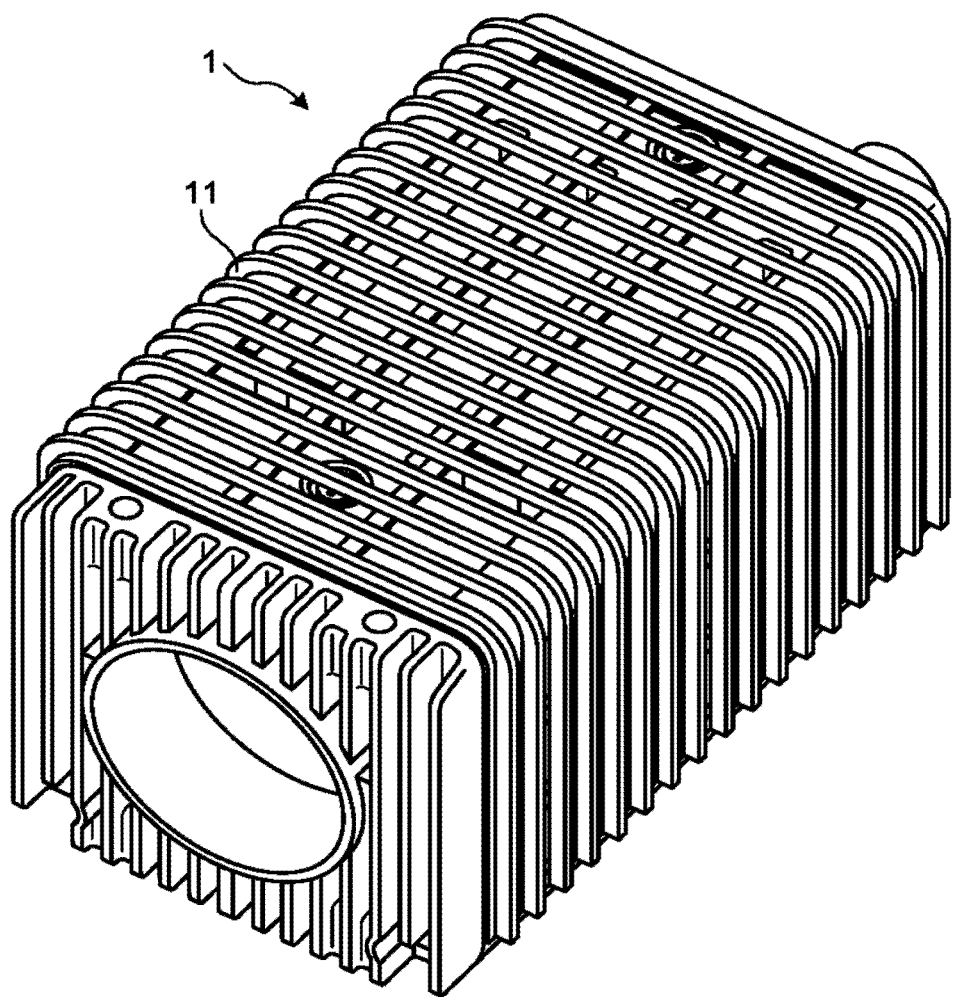
FIG. 5 is an external perspective view of a state in which a burn prevention cover is attached to the electronic device.

FIG. 4 is an external perspective view illustrating a configuration example of an electronic device 1 according to a second embodiment. In the second embodiment, a burn prevention cover 11 is attachable to the casing of the electronic device 1. FIG. 5 is an external perspective view of a state in which the burn prevention cover 11 is attached to the electronic device 1. A configuration of the casing of the electronic device 1 is the same as illustrated in FIG. 1 to FIG. 3A.

In the first embodiment, the example has been described in which heat is dissipated from the electronic circuits that are provided on the both surfaces of the substrates to the casing via the heat-transfer members, so that it is possible to increase the surface temperature of the casing and it is expected to further increase the heat flow rate. However, in some cases, the upper limit temperature of the surface of the casing is determined from the view point of preventing low temperature burn or the like, and therefore, it is not preferable to merely increase the surface temperature of the casing. To cope with this situation, the second embodiment is configured to allow the burn prevention cover 11 to be attached to maintain the safety even when the surface temperature of the casing is increased.

In FIG. 4 and FIG. 5, the burn prevention cover 11 is made with, for example, resin or the like, and configured such that vertical and horizontal ribs are connected in a mesh-like manner (grid-like manner) to ensure the breathability so as not to impede thermal convection for heat discharging and so as to prevent the top cover 5 from being directly touched with a finger of the hand of a user. The reason why only the top cover 5 is covered by the burn prevention cover 11 is that it is assumed that the temperature of the center of the casing is most increased and the user holds a portion of the op cover 5 by his/her hand. Therefore, if it is assumed that the temperature of a different portion of the casing is considerably increased and the portion may be touched by the hand of the user, the shape of the burn prevention cover 11 is changed so as to cover the portion.

Intervals and thicknesses of the ribs of the burn prevention cover 11 are set to certain sizes such that when the user touches the electronic device 1 (when the user holds the burn prevention cover 11 by his/her hand, for example) the top cover 5 is not directly touched with a finger of the user, e.g, the finger does not slit in a gap between the meshes and the tip of the finger or the like does not touch the top cover 5. The burn prevention cover 11 may be engaged with the casing by a claw or the like (not illustrated) that is provided in a part of the burn prevention cover 11, or may be fixed to the casing with a screw or the like.

The upper limit temperature of the surface of the casing, which is determined from the viewpoint of preventing low temperature burn or the like, is set to 60° C. when the surface of the casing is made with metal and set to 75° C. when the surface of the casing is made with resin, for example. Therefore, in this example, when the burn prevention cover 11 is made with resin, it is sufficient to reduce the surface temperature of the burn prevention cover 11 to be equal to or lower than 75° C. Resin has a low heat transfer coefficient, and the burn prevention cover 11 is formed in a mesh-like shape with fine ribs with small contact surfaces with the top cover 5; therefore, it is possible to increase the temperature of the top cover 5 up to a temperature higher than the surface temperature of 5° C. of the burn prevention cover 11, and it is possible to improve the heat dissipate effect while preventing low temperature burn or the like. However, the temperature of the top cover 5 is restricted by the upper limit temperature that is determined from the viewpoint of preventing degradation or breakdown of electronic circuits and the like in the casing.

Third Embodiment

Figure 6:
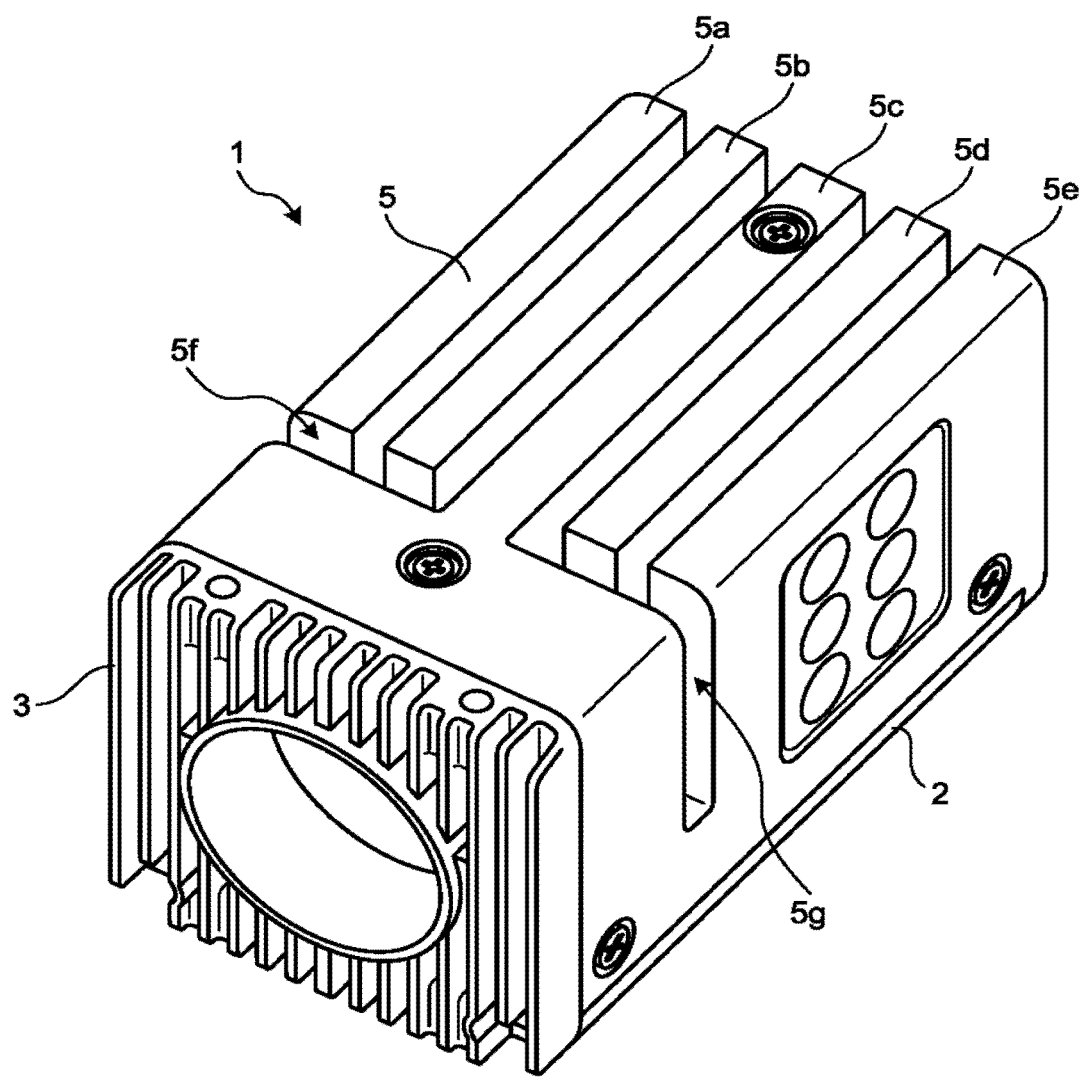
FIG. 6 is an external perspective view illustrating a configuration example of an electronic device according to a third embodiment.

FIG. 6 is an external perspective view illustrating a configuration example of an electronic device 1 according to a third embodiment. In the third embodiment, the shape of the top cover 5 is modified. In other words, the back cover 4 is integrated with the top cover 5 illustrated in FIG. 1 etc., and inter-fin concave portions on end portions of the hollow fins 5a to 5e of the top cover 5 penetrate to the back surface. The end view around the center e top cover 5 is the same as FIG. 3A.

Figure 7:
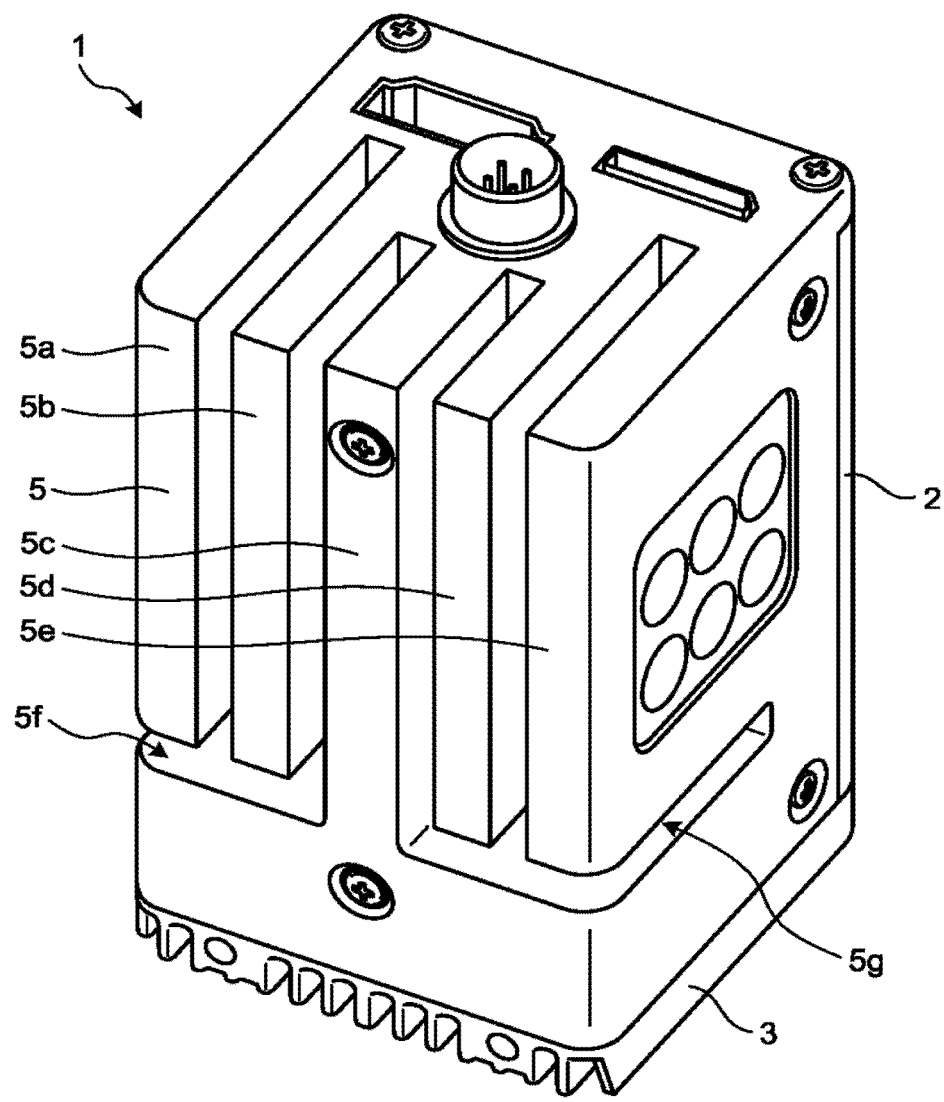
FIG. 7 is an external perspective view illustrating arrangement that is adopted when the electronic device is used.

FIG. 7 is an external perspective view illustrating arrangement that is adopted when the electronic device 1 illustrated in FIG. 6 is used, in particular, when the electronic device 1 is used as a microscope camera or the like with the front cover 3 facing downward. In this use condition, the hollow fins 5a to 5e of the top cover 5 are arranged in the vertical direction, and air flows in from lower concave portions 5f and 5g and flows out from upper ends through the concave portions of the fins 5a to 5e; therefore, the heat dissipate effect is improved.

Fourth Embodiment

Figure 8:
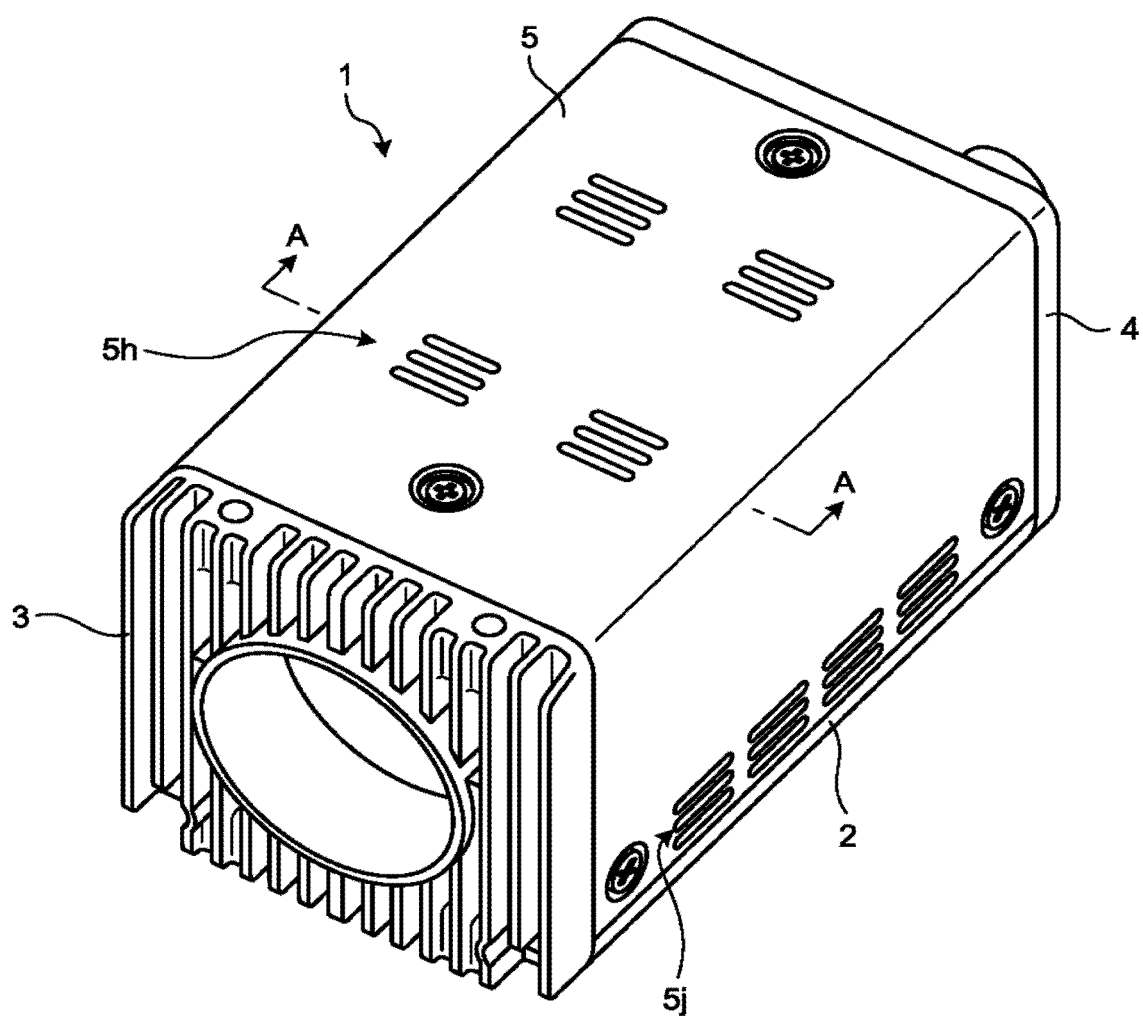
FIG. 8 is an external perspective view illustrating a configuration example of an electronic device according to a fourth embodiment.
Figure 9:
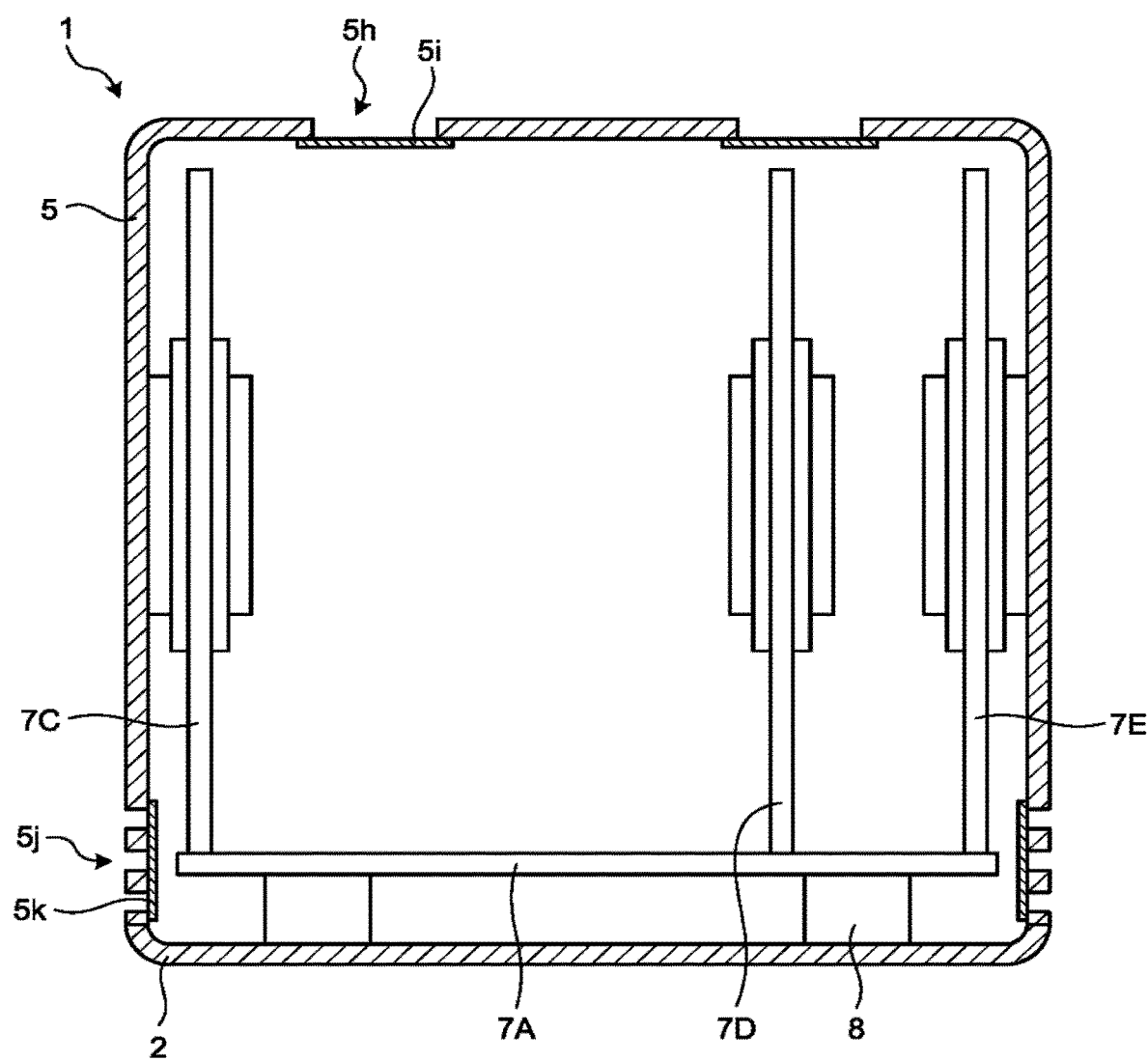
FIG. 9 is an end view taken along A-A in FIG. 8.

FIG. 8 is an external perspective view illustrating a configuration example of an electronic device 1 according to a fourth embodiment. In the fourth embodiment, hollow fins are not provided on the top cover 5 of the electronic device 1, but a plurality of air outlets 5h and air inlets 5j are provided instead. FIG. 9 is an end view taken along A-A in FIG. 8.

In FIG. 8 and FIG. 9, the electronic device 1 has a casing that is formed in an approximately rectangular box shape with the bottom cover 2 that constitutes a bottom surface and a part of side surfaces, the front cover 3 that constitutes a front surface, the back cover 4 that constitutes a back surface, and the top cover 5 that constitutes an upper surface and most of the side surfaces. In the casing of the electronic device 1, the substrate 7A is fixed with the spacer 8, and the substrates 7C, 7D, and 7E are fixed in the vertical direction on the substrate 7A. Configurations of the components other than the top cover 5 are the same as those illustrated in FIG. 1 etc.

The top cover 5 includes a flat top portion and left and right side plate portions. The plurality of air outlets 5h are provided on the top portion, and the plurality of air inlets 5h are provided on the side plate portions. Further, breathable sheets 5i with breathability, waterproof property, and dust resistance (which are waterproof, dust resistant, and breathable) are provided on the inner sides of the air outlets 5h so as to cover the air outlets 5h. Similarly, breathable sheets 5k with breathability, waterproof property, and dust resistance are provided on the inner sides of the air inlets 5j so as to cover the air inlets 5j. The breathable sheets 5i and 5k are configured with, for example, films with a large number of fine pores, or the like.

In this manner, by providing the air outlets 5h and the air inlets 5j covered with the breathable sheets 5i and 5k on the top cover 5, thermal convection occurs with heat that is generated by the electronic circuits 9 and the like of the substrates 7A, 7C, 7D, 7E, and the like inside the casing through the pathway of outside air→the air inlets 5j→inside of the casing→the air outlets 5h→outside air, so that the heat dissipate effect is improved. Further, ventilation is performed inside the casing, so that the technology is applicable to a device that needs ventilation (for example, a device using air battery that needs fresh air for operation, a device that generates some kind of gas, and the like).

Meanwhile, the breathable sheets 5i and 5k realize breathability, waterproof property, and dust resistance by a film provided with a large number of fine pores or the like, but have large flow resistance due to the viscosity of air under a condition in which airflow is stopped, and therefore, thermal convection may be impeded in some cases. To prevent the situation as described above, for example, it is preferable to reduce the opening areas of the air outlets 5h. It is possible to set adequately large opening areas for the air inlets 5j. For example, the following relationship is preferable: a sum of the opening areas of the air outlets 5h<a sum of the opening areas of the air inlets 5j. By reducing the opening areas of the air outlets 5h, air pressure around the air outlets 5h increases inside the casing and an air pressure difference with respect to the outside air occurs, so that air is likely to flow from the air outlets 5h to the outside. If the air outlets 5h and the air inlets 5j have the same size, it may be possible to reduce the number of the air outlets 5h as compared to the number of the air inlets 5j in order to produce a difference between the sums of the opening areas. With the occurrence of airflow, airflow resistance is reduced; therefore, airflow can be easily maintained even when air pressure around the air outlets 5h is reduced due to the airflow, and thus thermal convection occurs effectively. To increase the air pressure difference and improve the airflow, it is preferable to increase the height of the casing as much as possible.

Fifth Embodiment

Figure 10:
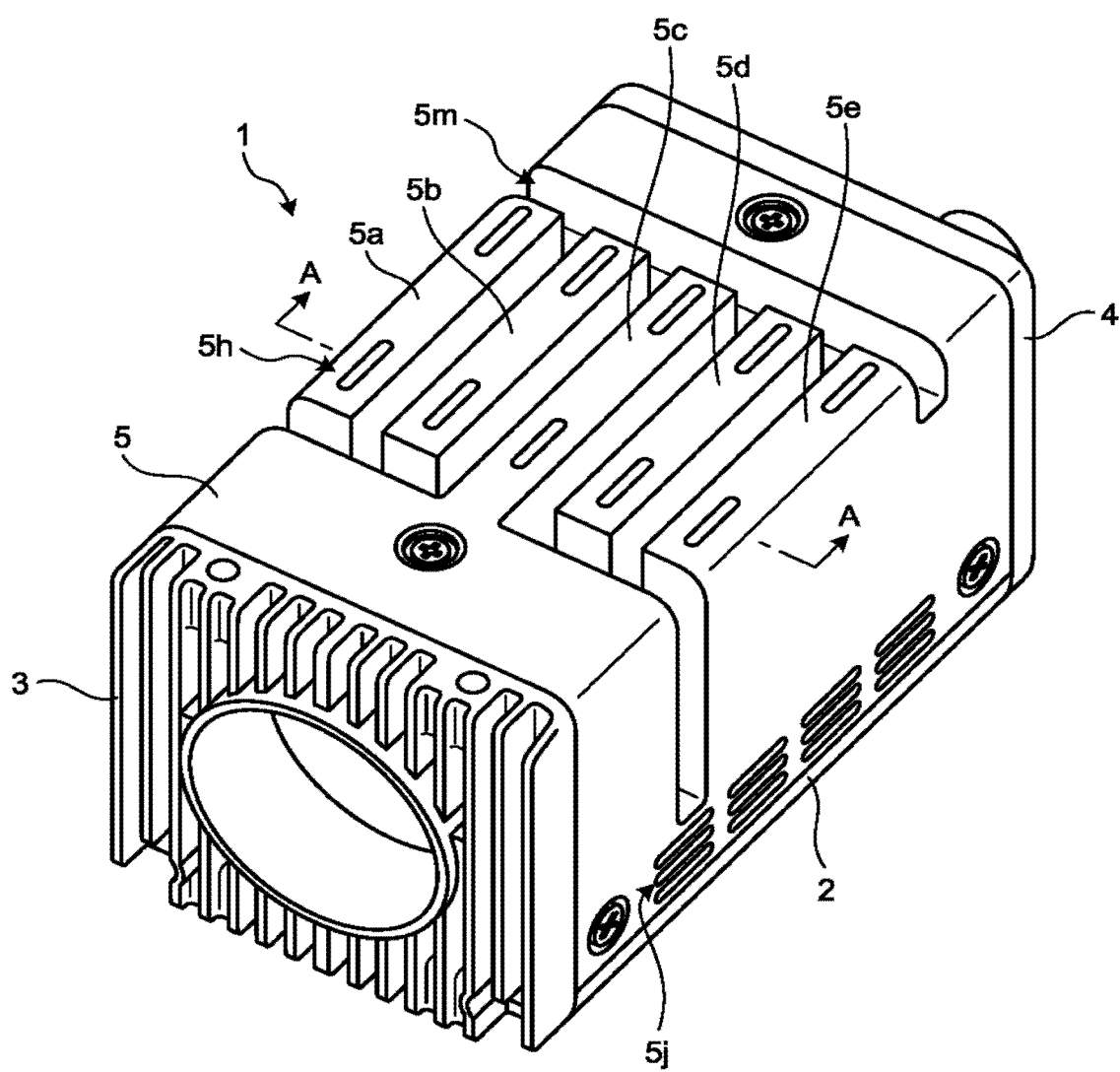
FIG. 10 is an external perspective view illustrating a configuration example of an electronic device according to a fifth embodiment.
Figure 11:
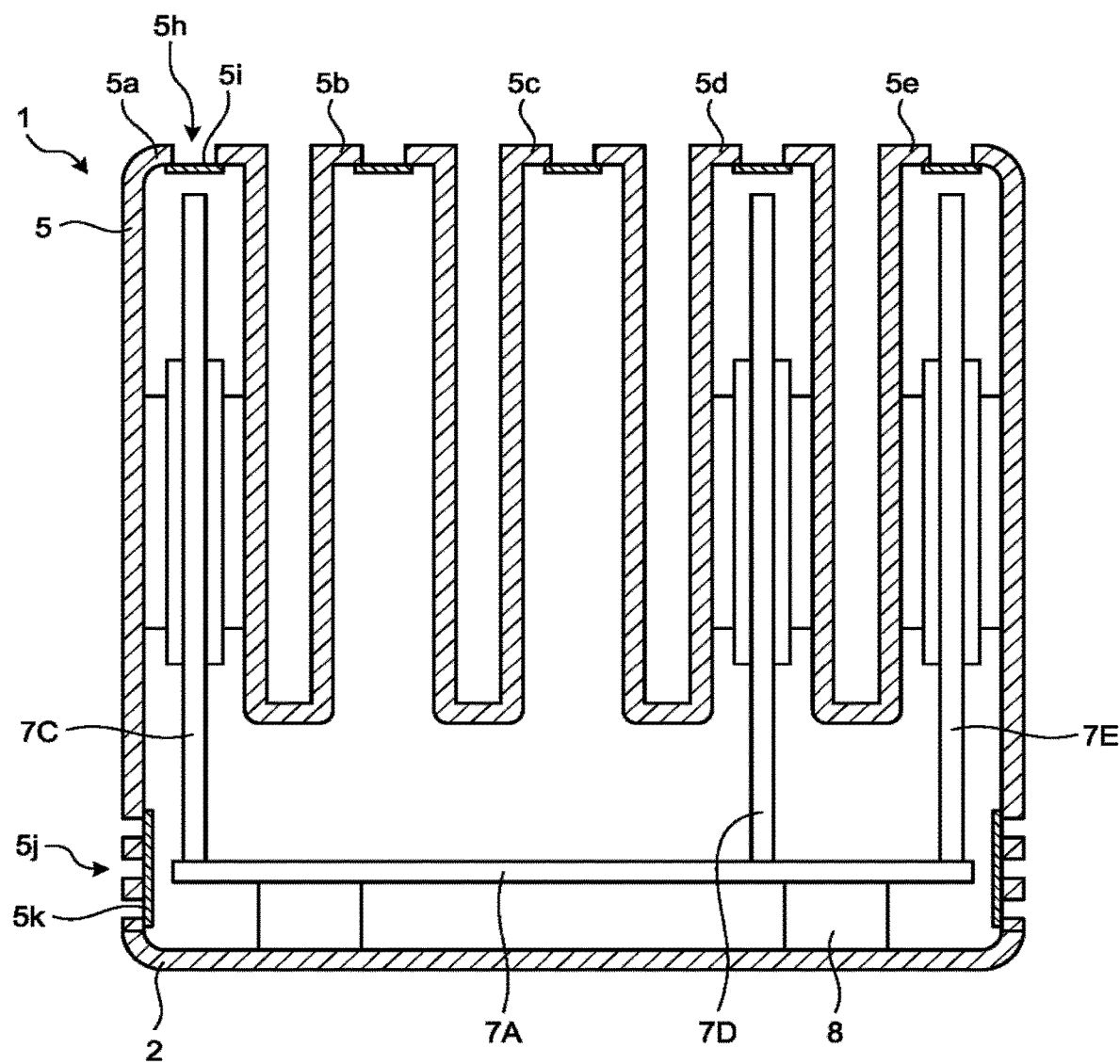
FIG. 11 is an end view taken along A-A in FIG. 10.

FIG. 10 is an external perspective view illustrating a configuration example of an electronic device 1 according to a fifth embodiment. The fifth embodiment is a combination of the first embodiment illustrated in FIG. 1 and the fourth embodiment illustrated in FIG. 8. FIG. 11 is an end view taken along A-A in FIG. 10.

In FIG. 10 and FIG. 11, the electronic device 1 has a casing that is formed in an approximately rectangular box shape with the bottom cover 2 that constitutes a bottom surface and a part of side surfaces, the front cover 3 that constitutes a front surface, the back cover 4 that constitutes a back surface, and the top cover 5 that constitutes an upper surface and most of the side surfaces. In the casing of the electronic device 1, the substrate 7A is fixed with the spacer 8, and the substrates 7C, 7D, and 7E are fixed in the vertical direction on the substrate 7A. Configurations of the components other than the top cover 5 are the same as those illustrated in FIG. 1 etc.

The hollow fins 5a to 5e are provided on the top cover 5 similarly to the configuration illustrated in FIG. 1, but a concave portion 5m is further provided across the fins 5a to 5e at a predetermined position from the back cover 4 side. Further, the plurality of air outlets 5h are provided on the upper surfaces of the fins 5a to 5e, and the plurality of air inlets 5j are provided in the lower parts of the side surfaces of the top cover 5. Furthermore, the breathable sheets 5i with breathability, waterproof property, and dust resistance are provided on the inner sides of the air outlets 5h so as to cover the air outlets 5h. Similarly, the breathable sheets 5k with breathability, waterproof property, and dust resistance are provided on the inner sides of the air inlets 5j so as to cover the air inlets 5j.

In this manner, by providing the air outlets 5h covered with the breathable sheets 5i on the upper surfaces of the hollow fins 5a to 5e of the top cover 5, and providing the air inlets 5j covered with the breathable sheets 5k in the lower parts of the side surface, the hollow fins 5a to 5e have the same configuration as a chimney pipe that increases thermal convection from the lower side to the upper side and improve the heat dissipate effect. Further, the concave portion 5m that is provided across the fins 5a to 5e divides upper portions of the respective fins 5a to 5e, so that heated air is likely to be accumulated. With this configuration, an air pressure difference with respect to the outside air is increased and flow toward the outside air is accelerated.

Figure 12:
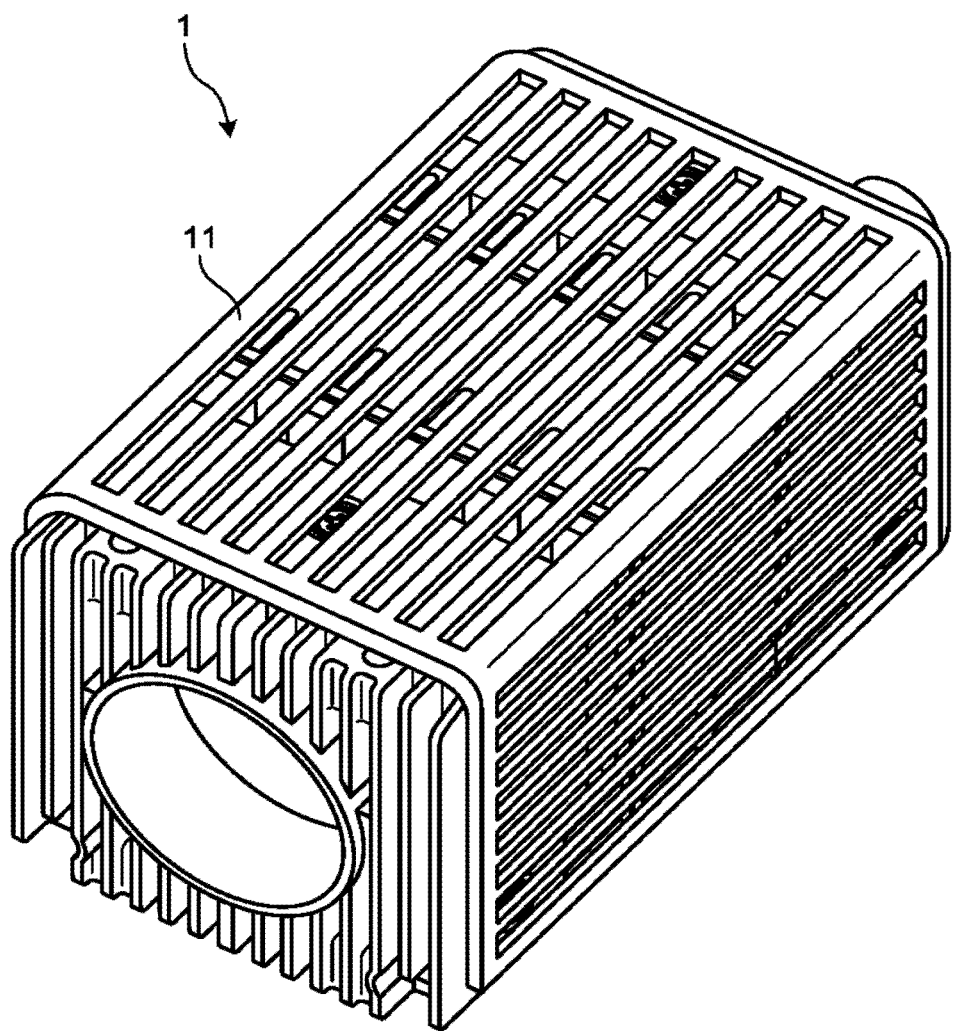
FIG. 12 is an external perspective view of a state in which a burn prevention cover is attached to the electronic device.

It may be possible to attach the burn prevention cover 11 even in the present embodiment. FIG. 12 is an external perspective view of a state in which the burn prevention cover 11 is attached to the electronic device 1. The burn prevention cover 11 illustrated in FIG. 5 and the burn prevention cover 11 illustrated in FIG. 12 have slightly different mesh patterns, but it is possible to adopt either one of the patterns or adopt still another pattern. That is, it is possible to adopt any configuration that ensures breathability and that prevents a user from directly touching a heated portion, such as the top cover 5, with his/her finger when the user touches the electronic device 1.

Sixth Embodiment

Figure 13:
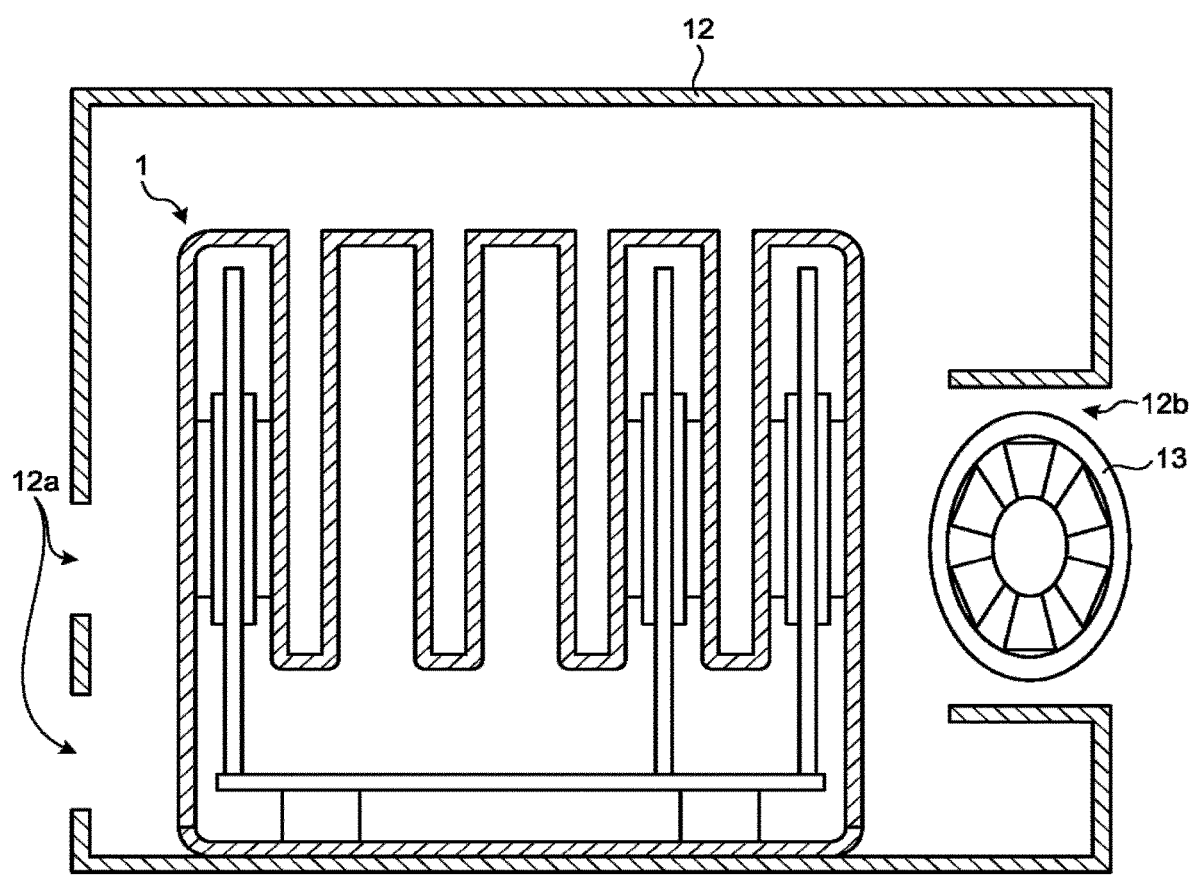
FIG. 13 is an end view illustrating a first configuration example of an electronic device according to a sixth embodiment.
Figure 14:
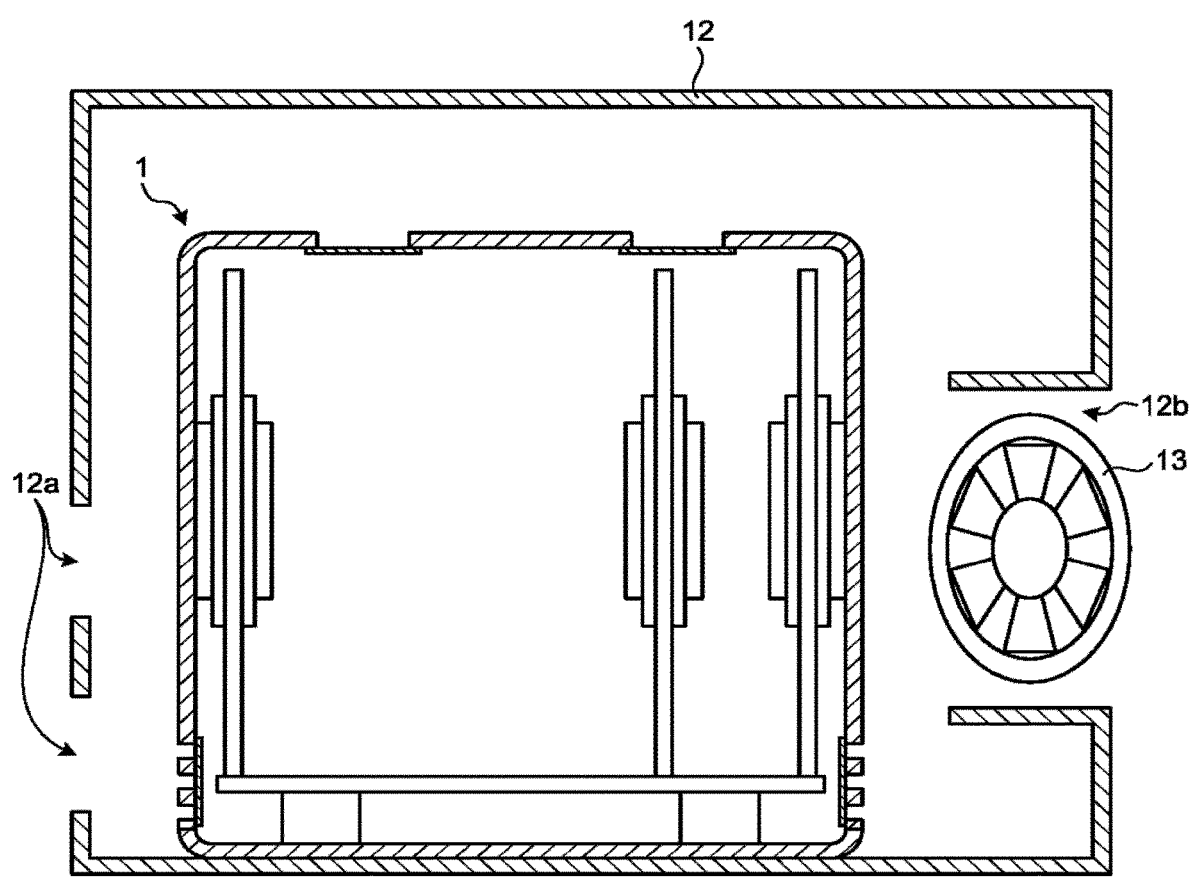
FIG. 14 is an end view illustrating a second configuration example of the electronic device according to the sixth embodiment.
Figure 15:
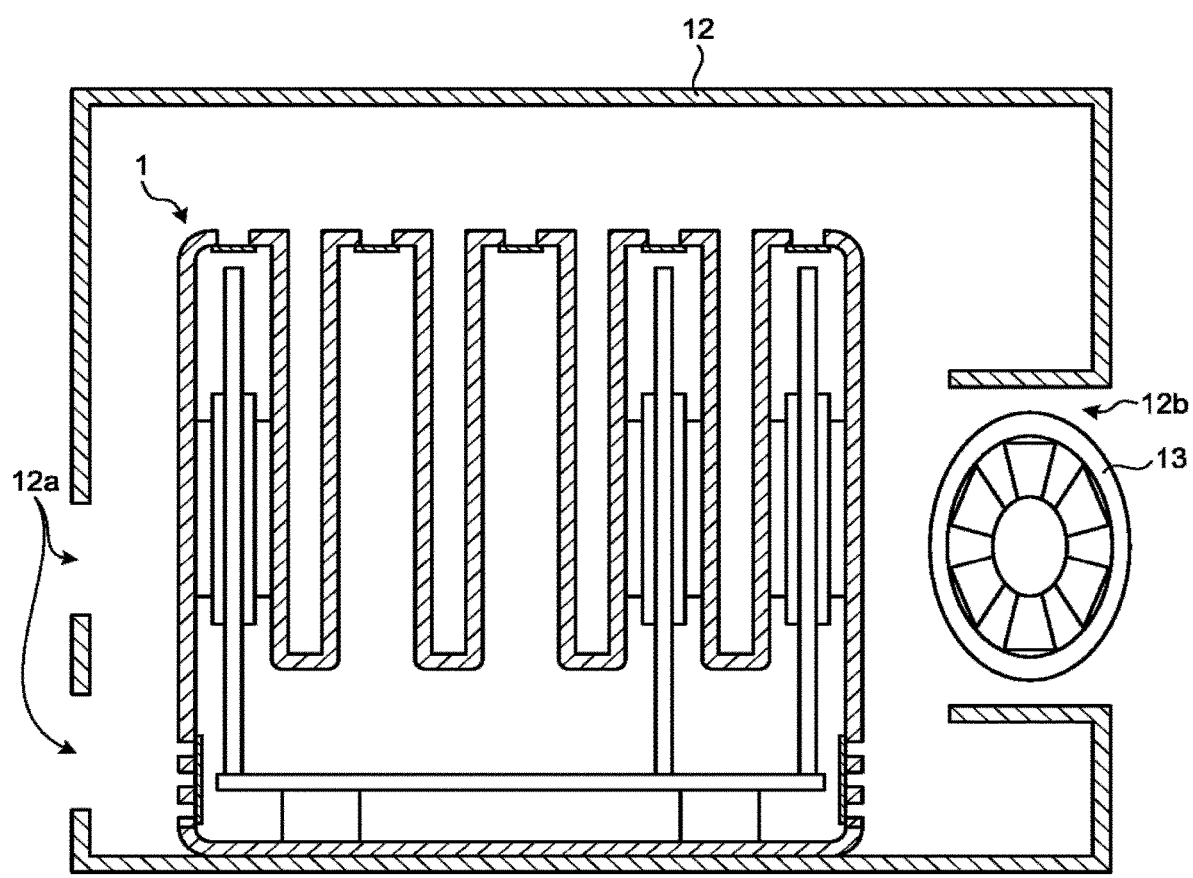
FIG. 15 is an end view illustrating a third configuration example of the electronic device according to the sixth embodiment.

FIG. 13 to FIG. 15 are end views illustrating configuration examples of an electronic device 1 according to a sixth embodiment. In the sixth embodiment, any of the electronic device 1 according to the first and third embodiments as illustrated in FIG. 3A, the electronic device 1 according to the fourth embodiment as illustrated in FIG. 9, and the electronic device 1 according to the fifth embodiment as illustrated in FIG. 11 is cooled. The present embodiment is applicable to a case in which the electronic device 1 is incorporated into a larger electronic device that includes a cooling unit, or a case in which the electronic device 1 includes a cooling unit. Hereinafter, a case will be described in which the electronic device 1 is incorporated into a larger electronic device that includes a casing 12 and a cooling unit. The cooling unit includes, for example, a cooling fan 13 for blowing air into the casing 12.

In FIG. 13, the electronic device 1 of the first and third embodiments as illustrated in FIG. 3A is arranged inside the casing 12. Vents 12a are provided at one end of the casing 12, a vent 12b is provided at the other end of the casing 12, and the cooling fan 13 is provided at the vent 12b.

In FIG. 14, the electronic device 1 according to the fourth embodiment as illustrated in FIG. 9 is arranged inside the casing 12. The vents 12a are provided at one end of the casing 12, the vent 12b is provided at the other end of the casing 12, and the cooling fan 13 is provided at the vent 12b.

In FIG. 15, the electronic device 1 according to the fifth embodiment as illustrated in FIG. 11 is arranged inside the casing 12. The vents 12a are provided at one end of the casing 12, the vent 12b is provided at the other end of the casing 12, and the cooling fan 13 is provided at the vent 12b.

It is preferable to determine a positional relationship between the cooling fan 13 and the electronic device 1 such that the electronic device 1 can be effectively cooled. For example, when the electronic device 1 of the first embodiment is used, the positional relationship between the cooling fan 13 and the electronic device 1 is determined such that air from the cooling fan 13 reaches the third surface. For another example, when the electronic device 1 of the third embodiment is used, the positional relationship between the cooling fan 13 and the electronic device 1 is determined such that air from the cooling fan 13 reaches at least one of the second surface and the third surface. The electronic device 1 is forcibly cooled by the airflow generated by the cooling fan 13, so that it is possible to adequately cool the electronic device 1. Further, in general, when a cooling fan is used to cool an electronic circuit inside an electronic device, the electronic device or the cooling fan may be broken down due to the influence of dust caught on the cooling fan. However, by applying the present embodiment, it is possible to effectively dissipate heat while ensuring the sealing performance of the electronic device 1. As a result, it is possible to increase the opening areas of the vents 12a and 12b of the casing 12, so that dust is less likely to be accumulated at the vents 12a and 12b. Furthermore, the casing 12 may be configured in an openable and closable manner, and it may be possible to request a user to perform operation of removing dust or the like inside the casing 12. As a result, it is possible to prevent reduction of the cooling effect and prevent breakdown of the electronic circuit and the cooling fan.

According to at least one of the embodiments as described above, it is possible to effectively dissipate heat from the electronic device.

The electronic device 1 as described above is not limited to a camera. The technology is applicable to any electronic device that needs to dissipate heat. The electronic device 1 may be, for example, a medical device or a part of a medical device. Further, the higher-level device described in the sixth embodiment may be, for example, a general-purpose personal computer device, an industrial server device, a medical device, or a part of a medical device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device comprising:
   a casing that includes a plurality of fins including hollow fins each of which extends in a direction in which the plurality of fins rise; and substrates that are inserted in the hollow fins so as to be sandwiched between inner walls of the hollow fins in a contact or non-contact manner, and that include electronic circuits, wherein each of the substrates corresponds to one of the hollow fins on a one-to-one basis, and each of the substrates is inserted in a corresponding one hollow fin of the hollow fins along a direction in which the each of the substrates spreads.

2. The electronic device according to claim 1, wherein the substrates are arranged approximately parallel to the inner walls of the hollow fins.

3. The electronic device according to claim 1, further comprising heat-transfer members that are arranged between the inner walls of the hollow fins and the substrates, and that come in contact with the inner walls of the hollow fins and the substrates.

4. The electronic device according to claim 3, wherein, in the hollow fin located on an outer side inside the casing among the hollow fins, a surface of the substrate facing the outer side of the casing does not come in contact with the inner wall of the hollow fin.

5. The electronic device according to claim 1, wherein the casing includes:
   a first surface,
   a second surface that faces the first surface,
   a third surface that is perpendicular to the second surface,
   a fourth surface that faces the third surface,
   a fifth surface that is perpendicular to the first surface and the third surface,
   a sixth surface that faces the fifth surface,
   a first member that corresponds to at least the third surface, the fifth surface, and the sixth surface and that includes the plurality of fins, and
   a second member that corresponds to the fourth surface, and
   the substrates are fixed to the second member.

6. The electronic device according to claim 5, further comprising a mesh-like cover that covers at least the third surface, the fifth surface, and the sixth surface.

7. The electronic device according to claim 6, wherein
   an air inlet for taking air into the casing is provided on at least one of the fifth surface and the sixth surface of the casing, and
   an air outlet for discharging air from inside of the casing is provided on the third surface of the casing.

8. The electronic device according to claim 6 further comprising an image sensor that is arranged along the first surface of the casing, that is connected to the electronic circuits, and that has a light receiving surface.

9. The electronic device according to claim 5, wherein
   an air inlet for taking air into the casing is provided on at least one of the fifth surface and the sixth surface of the casing, and
   an air outlet for discharging air from inside of the casing is provided on the third surface of the casing.

10. The electronic device according to claim 9, further comprising sheets that have breathability, waterproof property, and dust resistance and cover the air inlet and the air outlet.

11. The electronic device according to claim 5, further comprising an image sensor that is arranged along the first surface of the casing, that is connected to the electronic circuits, and that has a light receiving surface.

12. The electronic device according to claim 11, wherein the substrates are perpendicular to the light receiving surface.

13. The electronic device according to claim 1, wherein the casing includes:
    a first surface,
    a second surface that faces the first surface,
    a third surface that is perpendicular to the second surface,
    a fourth surface that faces the third surface,
    a fifth surface that is perpendicular to the first surface and the third surface, and
    the electronic device further comprising:
    a mesh-like cover that covers at least the third surface, the fifth surface, and the sixth surface.

14. The electronic device according to claim 13, wherein
    an air inlet for taking air into the casing is provided on at least one of the fifth surface and the sixth surface of the casing, and
    an air outlet for discharging air from inside of the casing is provided on the third surface of the casing.

15. The electronic device according to claim 13 further comprising an image sensor that is arranged along the first surface of the casing, that is connected to the electronic circuits, and that has a light receiving surface.

16. The electronic device according to claim 1, wherein the casing includes:
    a first surface,
    a second surface that faces the first surface,
    a third surface that is perpendicular to the second surface,
    a fourth surface that faces the third surface,
    a fifth surface that is perpendicular to the first surface and the third surface, and
    a sixth surface that faces the fifth surface,
    end surfaces of the plurality of fins are included in the third surface, and
    side surfaces of the plurality of fins are parallel to the fifth surface and the sixth surface.

17. The electronic device according to claim 16, wherein
    an air inlet for taking air into the casing is provided on at least one of the fifth surface and the sixth surface of the casing, and
    an air outlet for discharging air from inside of the casing is provided on the third surface of the casing.

18. The electronic device according to claim 16 further comprising an image sensor that is arranged along the first surface of the casing, that is connected to the electronic circuits, and that has a light receiving surface.

19. The electronic device according to claim 1 further comprising a cooling unit that cools the casing.

20. An electronic device comprising:
    a casing that includes a plurality of fins including hollow fins; and
    substrates that are inserted in the hollow fins so as to be sandwiched between inner walls of the hollow fins in a contact manner, and that include electronic circuits,
    wherein the substrates are inserted in the hollow fins with both surfaces of the substrates being in contact with the inner walls of the hollow fins.

* * * * *